(12) United States Patent
Hung et al.

(10) Patent No.: US 12,235,329 B2
(45) Date of Patent: Feb. 25, 2025

(54) SYNCHRONOUS RECTIFICATION CIRCUIT

(71) Applicant: INFSITRONIX TECHNOLOGY CORPORATION, Jhubei (TW)

(72) Inventors: Chung-Chih Hung, Jhubei (TW); Yuan-Kai Cheng, Jhubei (TW)

(73) Assignee: Infsitronix Technology Corporation, Jhubei (TW)

( * ) Notice: Subject to any disclaimer, the term of this patent is extended or adjusted under 35 U.S.C. 154(b) by 105 days.

(21) Appl. No.: 17/951,616

(22) Filed: Sep. 23, 2022

(65) Prior Publication Data

US 2023/0216419 A1 Jul. 6, 2023

Related U.S. Application Data

(60) Provisional application No. 63/247,487, filed on Sep. 23, 2021.

(51) Int. Cl.
*H02M 3/335* (2006.01)
*G01K 7/22* (2006.01)
(Continued)

(52) U.S. Cl.
CPC .............. *G01R 31/40* (2013.01); *G01K 7/22* (2013.01); *G01R 15/04* (2013.01);
(Continued)

(58) Field of Classification Search
CPC ............ H02M 3/22; H02M 1/08; H02M 1/36; H02M 3/24; H02M 3/325; H02M 3/335; H02M 3/28; H02M 3/01; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/33561; H02M 3/155; H02M 3/1582; H02M 1/4233;
(Continued)

(56) References Cited

U.S. PATENT DOCUMENTS

| | | | | |
|---|---|---|---|---|
| 7,212,417 B2 * | 5/2007 | Fukumoto | ......... | H02M 3/33507 363/21.01 |
| 7,733,068 B2 * | 6/2010 | Noda | ................ | H02M 3/1588 323/224 |

(Continued)

FOREIGN PATENT DOCUMENTS

| | | |
|---|---|---|
| EP | 2869447 A1 | 5/2015 |
| TW | 201701577 A | 1/2017 |

OTHER PUBLICATIONS

Official Action mailed to Corresponding Taiwanese Patent Application No. 111136127 on Nov. 7, 2023.
Search Report mailed to Corresponding Taiwanese Patent Application No. 111136127.
Reference Literature mailed to Corresponding Taiwanese Patent Application No. 111136127.
First Office Action for Taiwanese counterpart Application No. 111136127 issued on Feb. 23, 2023.
(Continued)

*Primary Examiner* — Jeffrey A Gblende
(74) *Attorney, Agent, or Firm* — Rosenberg, Klein & Lee

(57) ABSTRACT

The present application provides a synchronous rectification circuit, which adopts a multiplexer that selectively inputs a first reference signal or a second reference signal to a comparator by coupling the first and second reference signal. A comparing signal is generated to a switch element by comparing a switch input signal. Hereby, the switch element is under control for synchronous rectification.

10 Claims, 6 Drawing Sheets

(51) Int. Cl.
    *G01R 15/04*      (2006.01)
    *G01R 19/165*      (2006.01)
    *G01R 31/40*      (2020.01)
    *H02H 3/20*      (2006.01)
    *H02H 5/04*      (2006.01)

(52) U.S. Cl.
    CPC ............... *G01R 19/16538* (2013.01); *G01R 19/1659* (2013.01); *H02H 3/20* (2013.01); *H02H 5/04* (2013.01); *H02M 3/33592* (2013.01)

(58) Field of Classification Search
    CPC .......... H02M 1/12; H02M 3/07; H02M 7/219; H02M 7/4815; H02M 1/0048; H02M 7/4818; H02M 7/4826; H02M 7/4833; Y02B 70/1491
    See application file for complete search history.

(56) References Cited

U.S. PATENT DOCUMENTS

| | | | |
|---|---|---|---|
| 8,810,078 B2 * | 8/2014 | Saito | H02M 3/28 |
| | | | 307/140 |
| 10,033,268 B2 * | 7/2018 | Pan | G11C 5/145 |
| 11,088,627 B2 * | 8/2021 | Wang | H02M 3/33592 |
| 11,682,969 B2 * | 6/2023 | Zhang | H02M 1/15 |
| | | | 323/282 |
| 2019/0006950 A1 | 1/2019 | Kong et al. | |
| 2019/0165686 A1 | 5/2019 | Wang | |
| 2019/0393766 A1 * | 12/2019 | Nagamatsu | H02M 1/14 |
| 2021/0273567 A1 | 9/2021 | Sigamani | |

OTHER PUBLICATIONS

Search Report for Taiwanese counterpart Application No. 111136127 issued on Feb. 23, 2023.

\* cited by examiner

SYNCHRONOUS RECTIFICATION CIRCUIT

FIELD OF THE INVENTION

The present application generally relates to a rectification circuit, and particularly to a synchronous rectification circuit applicable to a power supplying devices.

BACKGROUND OF THE INVENTION

For modern switching power supplies, a rectification device will be generally connected in series at the output terminal for controlling the DC output voltage. The rectification device can be a rectifying diode. Nonetheless, with the technical development of electronic devices, the turn-on voltage of rectifying diodes limits the power supplying devices.

To meet the requirements of low output voltage and high output power, synchronous rectification circuits are developed to replace rectifying diodes. Nonetheless, in current techniques of synchronous rectification circuits, two or more comparators are required to compare two reference signals, respectively, for outputting the corresponding control signals to control the turning-on and off of rectifying transistors. Then, in the development of power supplying devices, the errors of the two comparators need to be processed first. In addition, two comparators will increase the power consumption and area of the overall circuit.

Specifically, the above two reference signals are used for judging when to turn on and cut off the transistors of a synchronous rectification circuit, respectively. When the two reference signals are processed by two different comparator circuits, the error components of the two different circuits might accumulate and further affect the accuracy of synchronous rectification. Accordingly, it is required to improve the current technologies.

SUMMARY

An objective of the present application is to provide a synchronous rectification circuit to solve the above problem. A multiplexer is adopted to alternatively input a first reference signal or a second reference signal to a comparator. Thereby, the comparator compares a detection signal of a switch and generates a comparison result signal. The comparison result signal is used for controlling the switch and thus rectifying the output voltage of a power supplying device. Hence, according to the present application, the power consumption of the power supplying device can be reduced. Besides, the overall circuit area can be reduced as well by using a single comparator.

To achieve the above objective, the present application provides a synchronous rectification circuit, which comprises a multiplexer, a comparator, and a switch. The multiplexer includes two input terminals and one output terminal. The output terminal of the multiplexer and a control terminal of the switch are coupled to the comparator. The two input terminals of the multiplexer are coupled to a first reference signal and a second reference signal. Thereby, the multiplexer alternatively inputs the first reference signal or the second reference signal to the multiplexer according to a comparison reference signal of the comparator. The comparator compares a detection signal of the switch according to the first reference signal or the second reference signal and generates a comparison result signal to the switch. According to the present application, a multiplexer and a comparator are adopted to control a switch for achieving synchronous rectification. Hence, the power consumption of the power supplying device and the area of the synchronous rectification circuit can be reduced.

DETAILED DESCRIPTION

In order to make the structure and characteristics as well as the effectiveness of the present application to be further understood and recognized, the detailed description of the present application is provided as follows along with embodiments and accompanying figures.

In the following description, various embodiments of the present application are described using figures for describing the present application in detail. Nonetheless, the concepts of the present application can be embodied in various forms. Those embodiments are not used to limit the scope and range of the present application.

Figure 1:
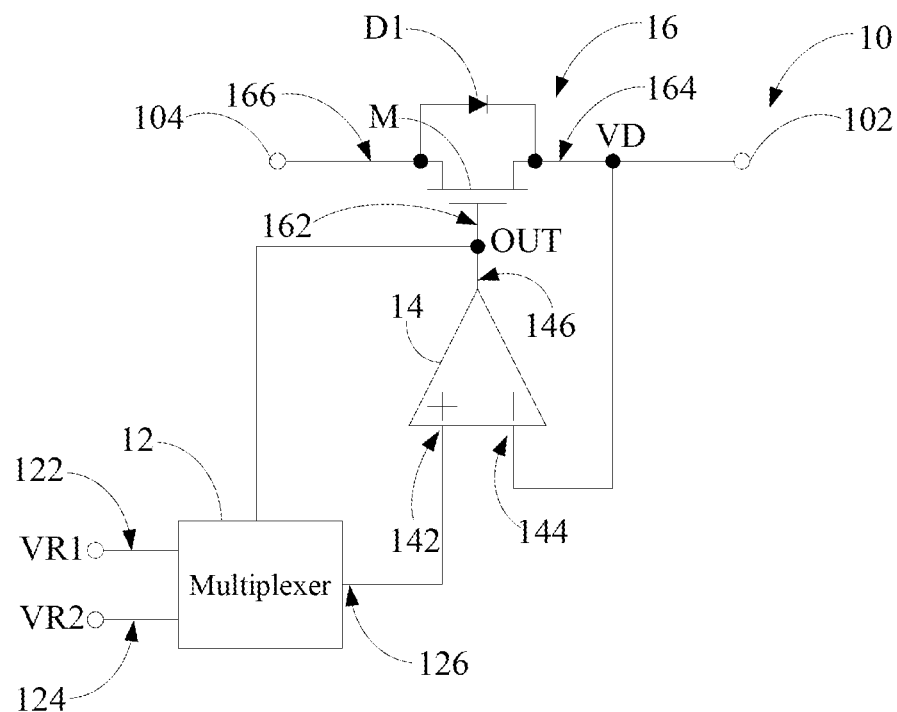
FIG. 1 shows a schematic diagram of the circuit according to the first embodiment of the present application.

First, please refer to FIG. 1, which shows a schematic diagram of the circuit according to the first embodiment of the present application. As shown in the figure, a synchronous rectification circuit 10 according to the present embodiment comprises a multiplexer 12, a comparator 14, and a switch 16. The multiplexer 12 includes a first input terminal 122, a second input terminal 124, and a first output terminal 126. In other words, the multiplexer 12 includes two input terminals and one output terminal. The first input terminal 122 according to the present embodiment is coupled to a first reference signal VR1. The second input terminal 124 according to the present embodiment is coupled to a second reference signal VR2. The output terminal 126 is coupled to the comparator 14. Thereby, the multiplexer 12 is coupled to the comparator 14. Hence, the first reference signal VR1 and the second reference signal VR2 according to the present embodiment are coupled to the two input terminals of the multiplexer 12.

Furthermore, the comparator 14 includes a positive input terminal 142, a negative input terminal 144, and a second output terminal 146. Namely, the comparator 14 also includes two input terminals and one output terminal. Nonetheless, the two input terminals of the comparator 14 will be subtracted for comparison. Thereby, they are named the positive input terminal 142 and the negative input terminal 144, respectively. The positive input terminal 142 according to the present embodiment is coupled to the first output terminal 126; the negative input terminal 144 according to the present embodiment is coupled to one terminal of the switch 16 for receiving a detection signal VD.

Moreover, a control terminal 162 of the switch 16 is coupled to the second output terminal 146 for receiving a comparison result signal and thus controlling the turning-on or off of the switch 16. The switch 16 can include a metal-oxide-semiconductor field-effect transistor (MOSFET) M. The control terminal 162 is the gate of the transistor M of the switch 16 and is coupled to the second output terminal 146. A switch output terminal 164 of the switch 16 is coupled to a rectification output terminal 102 of the synchronous rectification circuit 10. In other words, a drain of the transistor M is coupled to the rectification output terminal 102 of the synchronous rectification circuit 10. According to the present embodiment, the drain can provide the detection signal VD to the comparator 16. A switch input terminal 166 of the switch 16 is coupled to a rectification input terminal 104 of the synchronous rectification circuit 10. Namely, a source of the transistor M is coupled to the rectification input terminal 104 of the synchronous rectification circuit 10.

In particular, according to the present embodiment, the detection signal VD is provided by the drain of the transistor M of the switch 16. In other words, the detection signal VD is the drain voltage signal of the transistor M. In addition, according to the present application, other voltage supplying methods, such as using voltage division by impedance or connecting a parallel capacitor, can be adopted to represent the drain voltage signal of the switch 16 and act as the detection signal VD. According to the present embodiment, the transistor M of the switch 16 is a synchronous rectification MOSFET. The transistor M includes a parasitic diode D1 between the source and the drain.

Figure 2:
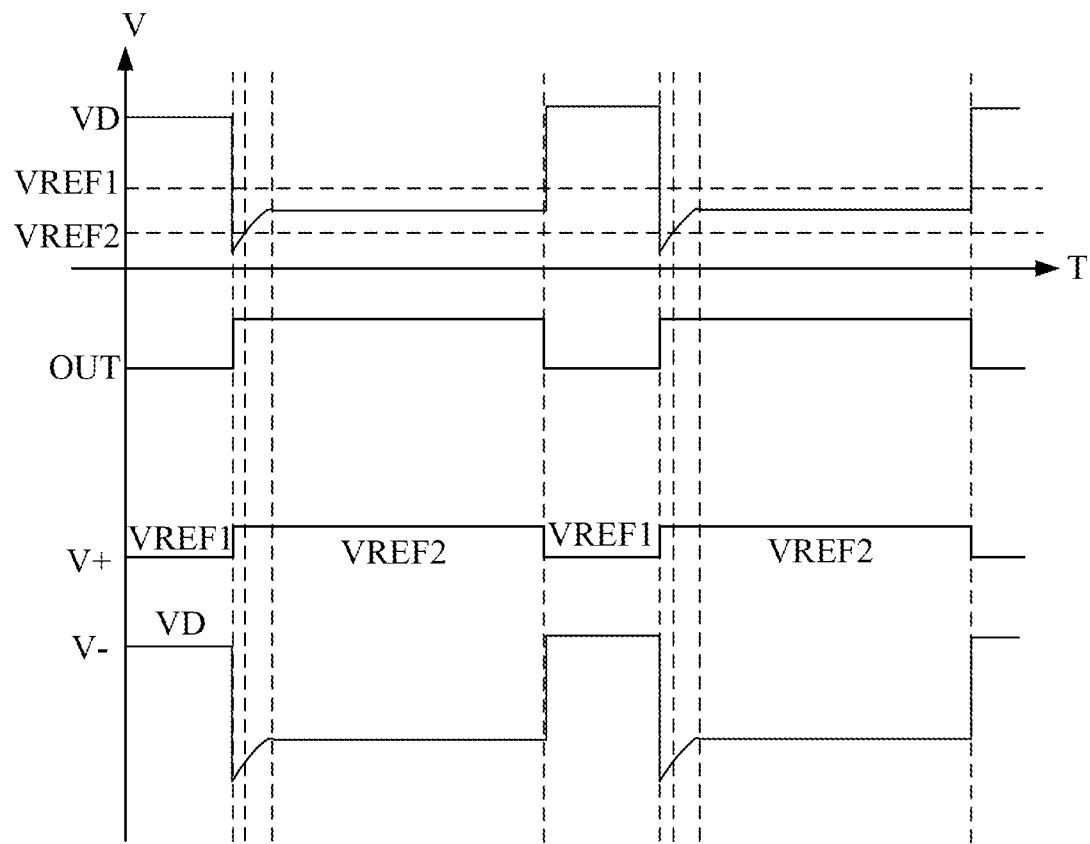
FIG. 2 shows a schematic diagram of signal operations according to the first embodiment of the present application.

Please refer to FIG. 1 again and to FIG. 2. The multiplexer 12 further receives a comparison reference signal from the switch 16 and selectively output the first reference signal VR1 or the second reference signal VR2 to be compared with the detection signal VD. After comparison, a comparison result signal OUT will be generated and transmitted to the switch 16. In other words, the comparison result signal OUT is transmitted to the control terminal 162 of the switch 16 for further controlling the turning-on or off of the switch 16. That is to say, the comparison result signal OUT is applied to the gate of the transistor M for turning on or off the path between the source and the drain of the transistor M, and thus turning on or off the path between the rectification output terminal 102 and the rectification input terminal 104. The comparator 14 compares the first reference signal VR1 with the detection signal VD. When the detection signal VD is smaller than the first reference signal VR1, the comparison result signal OUT controls the switch 16 to turn on. The comparator 14 compares the second reference signal VR2 with the detection signal VD. When the detection signal VD is greater than the second reference signal VR2, the comparison result signal OUT controls the switch 16 to turn off.

According to the present embodiment, the comparison result signal OUT is feedbacked to the multiplexer 12 and hence forming the comparison reference signal received by the multiplexer 12. This connection makes the control of the multiplexer easier as well as makes the circuit implementation less complex.

In addition to feedbacking the comparison result signal OUT to the multiplexer 12 and forming the comparison reference signal of the multiplexer 12, the present application can further delay the comparison result signal OUT of forming the comparison reference signal received by the multiplexer 12 for controlling the multiplexer 12 to selectively output the first reference signal VR1 or the second reference signal VR2 to the comparator 14. Thereby, some erroneous actions owing to the parasitic effects of circuits or insufficient processing speed of the multiplexer 12 can be avoided, as described in details below.

Figure 3:
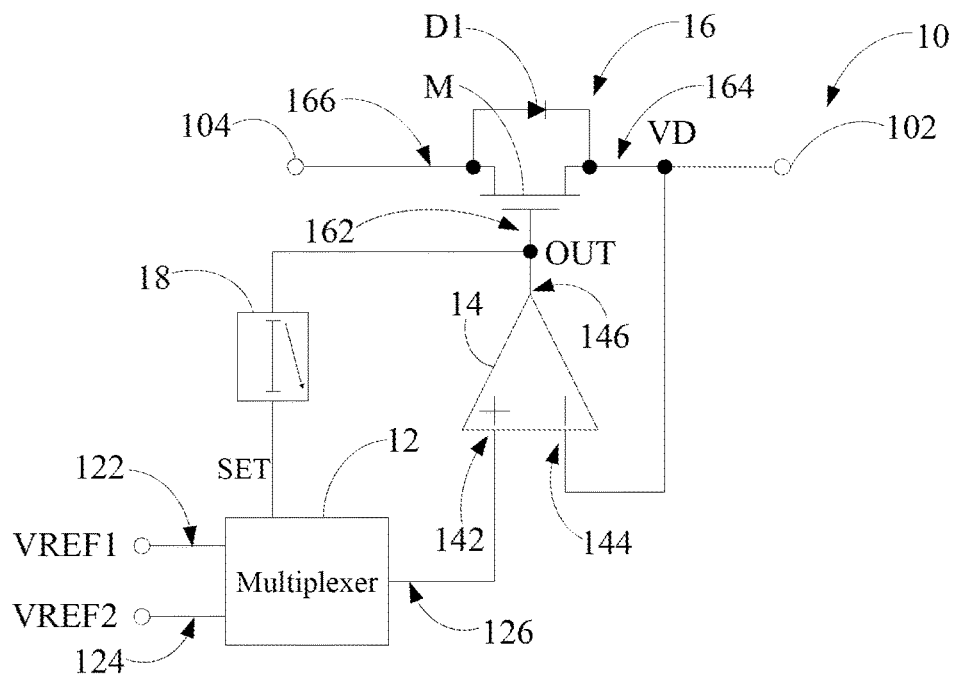
FIG. 3 shows a schematic diagram of the circuit according to the second embodiment of the present application.

Please refer to FIG. 3, which shows a schematic diagram of the circuit according to the second embodiment of the present application. The difference between the FIG. 1 and FIG. 3 is that the synchronous rectification circuit 10 in FIG. 3 further comprises a delay circuit 18 coupled between the multiplexer 12 and the comparator 14. The delay circuit 18 can receive and delay the comparison result signal OUT of the comparator 14 for generating the delayed comparison result signal OUT, namely, a delay signal SET. The delay signal SET is transmitted to the multiplexer 12 and acts as the comparison reference signal of the multiplexer 12.

Figure 4:
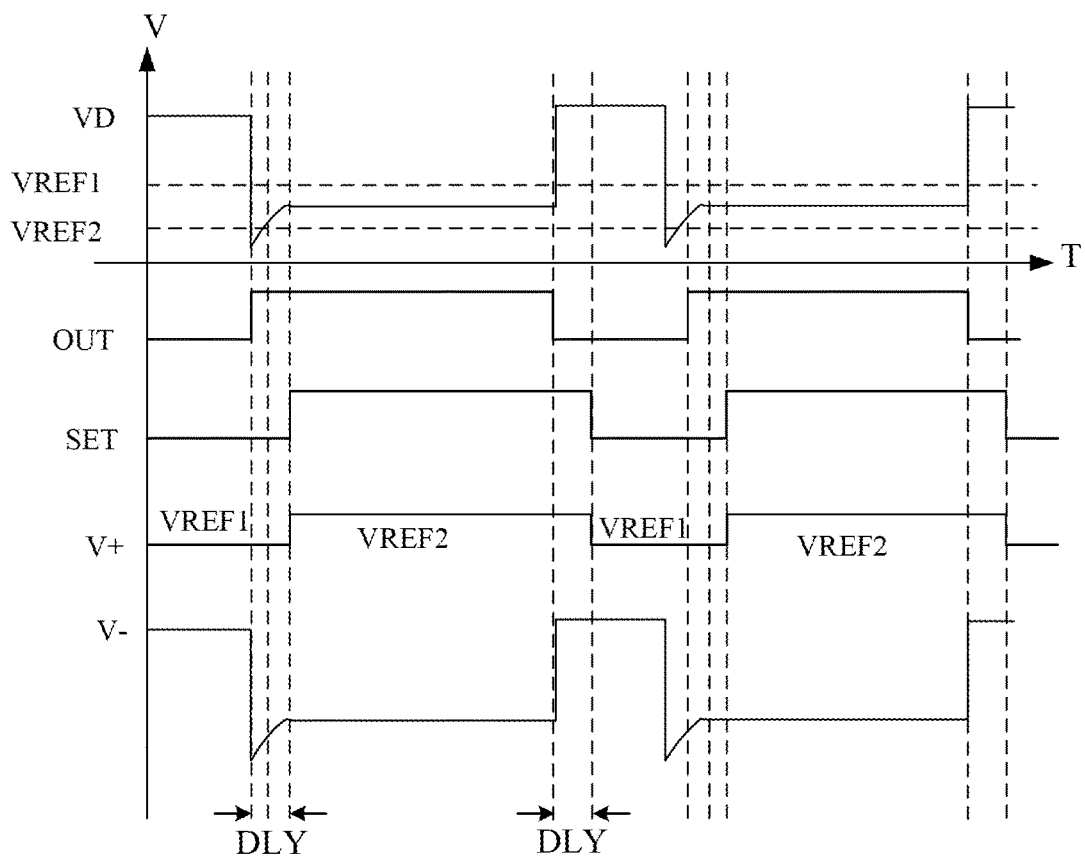
FIG. 4 shows a schematic diagram of signal operations according to the second embodiment of the present application.

Please refer to FIG. 3 again and to FIG. 4. According to the synchronous rectification circuit 10 of the present embodiment, the comparison result signal OUT is delayed for forming the comparison reference signal received by the multiplexer 12. In other words, the delay signal SET is formed for controlling the multiplexer 12 to alternatively output the first reference signal VR1 or the second reference signal VR2 to the comparator 14 and then the comparator 14 generates the comparison result signal OUT correspondingly. When the delay signal SET, namely, the comparison reference signal received by the multiplexer 12, is at a first level (a low level according to the present embodiment), the multiplexer 12 transmits the first reference signal VR1 to the comparator 14. When the delay signal SET, namely, the comparison reference signal received by the multiplexer 12, is at a second level (a high level according to the present embodiment), the multiplexer 12 transmits the second reference signal VR2 to the comparator 14. Besides, depending on the design of the multiplexer 12, the present application can further exchange the first level and the second level. In other words, the multiplexer 12 can receive the inverse signal of the delay signal SET.

In comparison with the previous embodiment, the comparison result signal OUT generated by the comparator 14 according to the present embodiment is transmitted to the delay circuit 18 and hence is delayed by a predetermined time DLY for forming the delay signal SET as the comparison reference signal input to the multiplexer 12. Then, the multiplexer 12 alternatively outputs the first reference signal VR1 or the second reference signal VR2 to the comparator 14 according to the comparison result signal OUT. Thereby, erroneous actions of the multiplexer 12 leading to errors in the comparator 14 can be avoided. Besides, the present embodiment also prevent the unstable comparison result signal OUT of the multiplexer 12 from outputting to the switch 16.

According to the above description, the synchronous rectification circuit 10 according to the present application uses the multiplexer 12 to alternatively output the first reference signal VR1 or the second reference signal VR2 to the comparator 14. IN addition, according to another embodiment of the present application, the multiplexer 12 can be tither coupled to the detection signal VD so that the multiplexer 12 can further optionally output the detection signal to the comparator 14.

Figure 5:
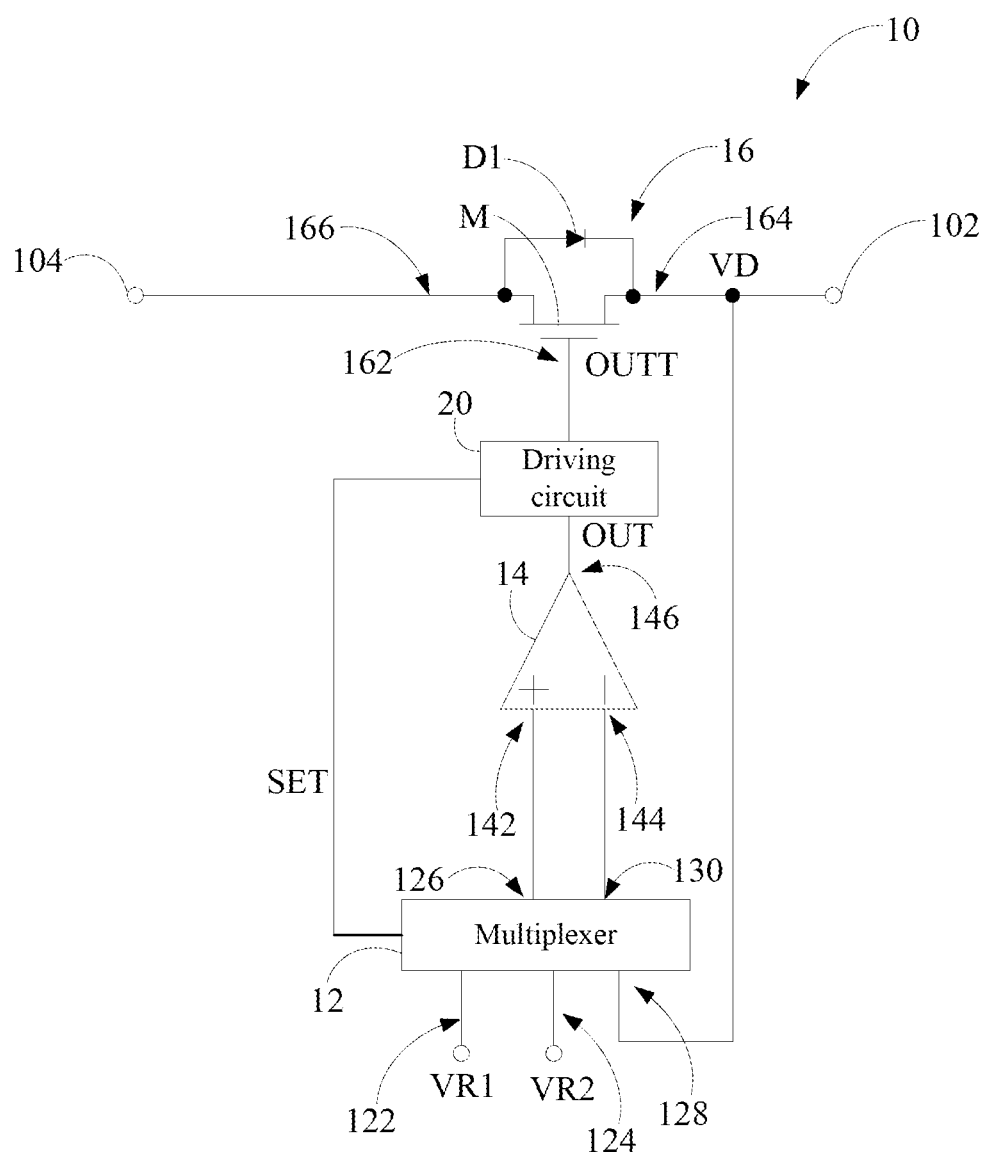
FIG. 5 shows a schematic diagram of the circuit according to the third embodiment of the present application.

FIG. 5 shows a schematic diagram of the circuit according to the third embodiment of the present application. The difference between FIG. 1 and FIG. 5 is that, in FIG. 5, the multiplexer 12 of the synchronous rectification circuit 10 is coupled to the detection signal VD, the first reference signal VR1, and the second reference signal VR for selectively outputting the detection signal VD and the first reference signal VR1 to the comparator 14 or selectively outputting the detection signal VD and the second reference signal VR2 to the comparator 14. In addition, FIG. 5 further comprises a driving circuit 20 coupled to the comparator 14 and the control terminal 162 of the switch 16. The details will be described in the following.

The multiplexer 12 according to the present embodiment includes three input terminals and two output terminals. In other words, in addition to the first input terminal 122, the second input terminal 124, and the first output terminal 126 contained in the multiplexer 12 according to the previous embodiment, the multiplexer 12 according to the present embodiment further include another input terminal and another output terminal, namely, a third input terminal 128 and a third output terminal 130. The third input terminal 128 of the multiplexer 12 is coupled to the detection signal VD; the third output terminal 130 is coupled to the negative input terminal 144 of the multiplexer 144. The remaining connections of the multiplexer 12 are identical to those according to the previous embodiment. Hence, the details will not be repeated.

Figure 6:
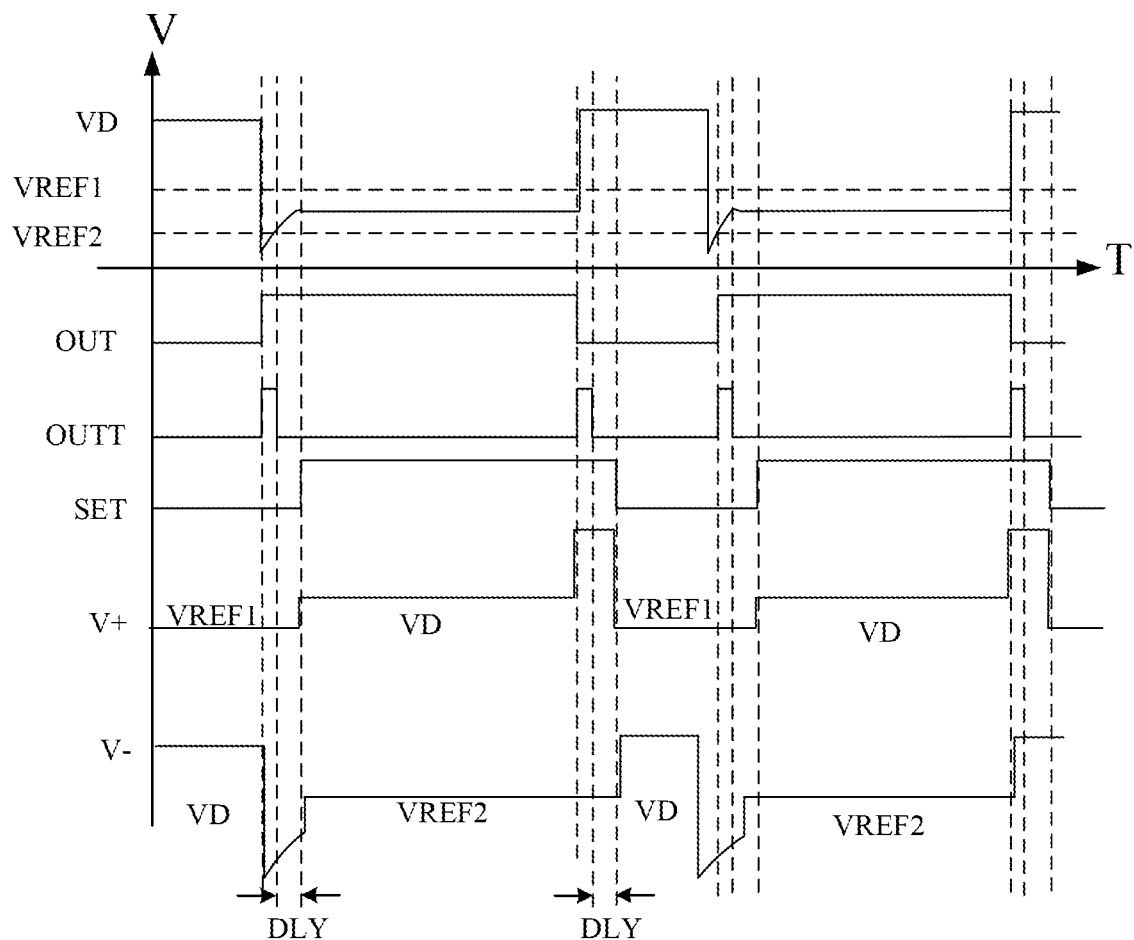
FIG. 6 shows a schematic diagram of signal operations according to the third embodiment of the present application.

Please refer to FIG. 5 and FIG. 6. The comparison result signal OUT generated by the comparator 14 is output to the driving circuit 20. The driving circuit 20 generates a driving signal OUTT to the control terminal 162 of the switch 16 according to the comparison result signal OUT for controlling the switch 16 to turn on or shut off. Thereby, it is avoided that the comparator 14 outputs the unstable comparison result signal OUT to the switch 16 under the influence of noise. Furthermore, the driving circuit 20 can generate the driving signal OUTT according to the waveform features, such as the rising and falling edges, of the comparison result signal OUT so that the control of the switch 16 can be calibrated more easily. The multiplexer 12 selectively outputs the detection signal VD, the first reference signal VR1, and the second reference signal VR2 to the comparator 14. When the comparison reference signal is at the first level (a low level according to the present embodiment), the multiplexer 12 transmits the first reference signal VR1 to the positive input terminal 142 of the comparator 14 and the detection signal VD to the negative input terminal 144 of the comparator 14. When the detection signal VD is smaller than the first reference signal VR1, the driving circuit 20 changes the state according to the comparison result signal OUT and generates a pulse in the driving signal OUTT for controlling the switch 16 to turn on. When the comparison reference signal is at the second level (a high level according to the present embodiment), the multiplexer 12 transmits the detection signal VD to the positive input terminal 142 of the comparator 14 and the second reference signal VR2 to the negative input terminal 144 of the comparator 14. Thereby, when the detection signal VD is greater than the second reference signal VR2, the driving circuit 20 changes the state according to the comparison result signal OUT and generates another pulse in the driving signal OUTT for controlling the switch 16 to cut off.

In the third embodiment described above, the comparison result signal input to the multiplexer 12 can be generated by the driving circuit 20 instead. In addition, the driving circuit 20 can integrate the function of the delay circuit 18 according to the previous embodiment for generating the delay signal SET, which is equivalent to delaying the comparison result signal OUT. The delay signal SET is transmitted to the multiplexer 12 and used as the comparison reference signal input to the multiplexer 12.

Figure 7:
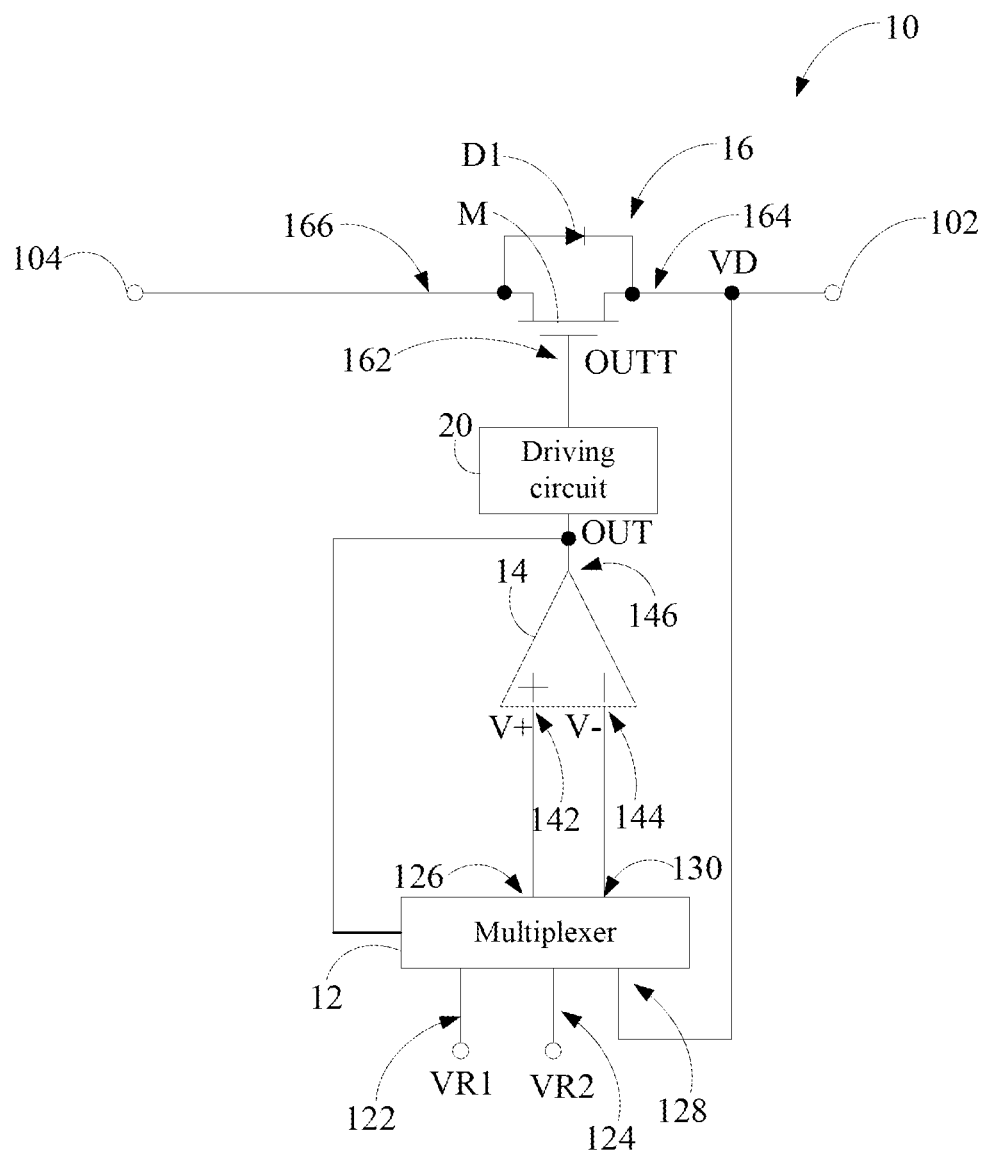
FIG. 7 shows a schematic diagram of the circuit according to the fourth embodiment of the present application.

Furthermore, FIG. 7 shows a schematic diagram of the circuit according to the fourth embodiment of the present application. The circuit is based on the one according to the third embodiment. However, the comparison result signal OUT is feedbacked to the multiplexer 12 and acts as the comparison reference signal input to the multiplexer 12. The remaining operations of signals are identical to those according to the third embodiment described above. Hence, the details will not be repeated.

Figure 8:
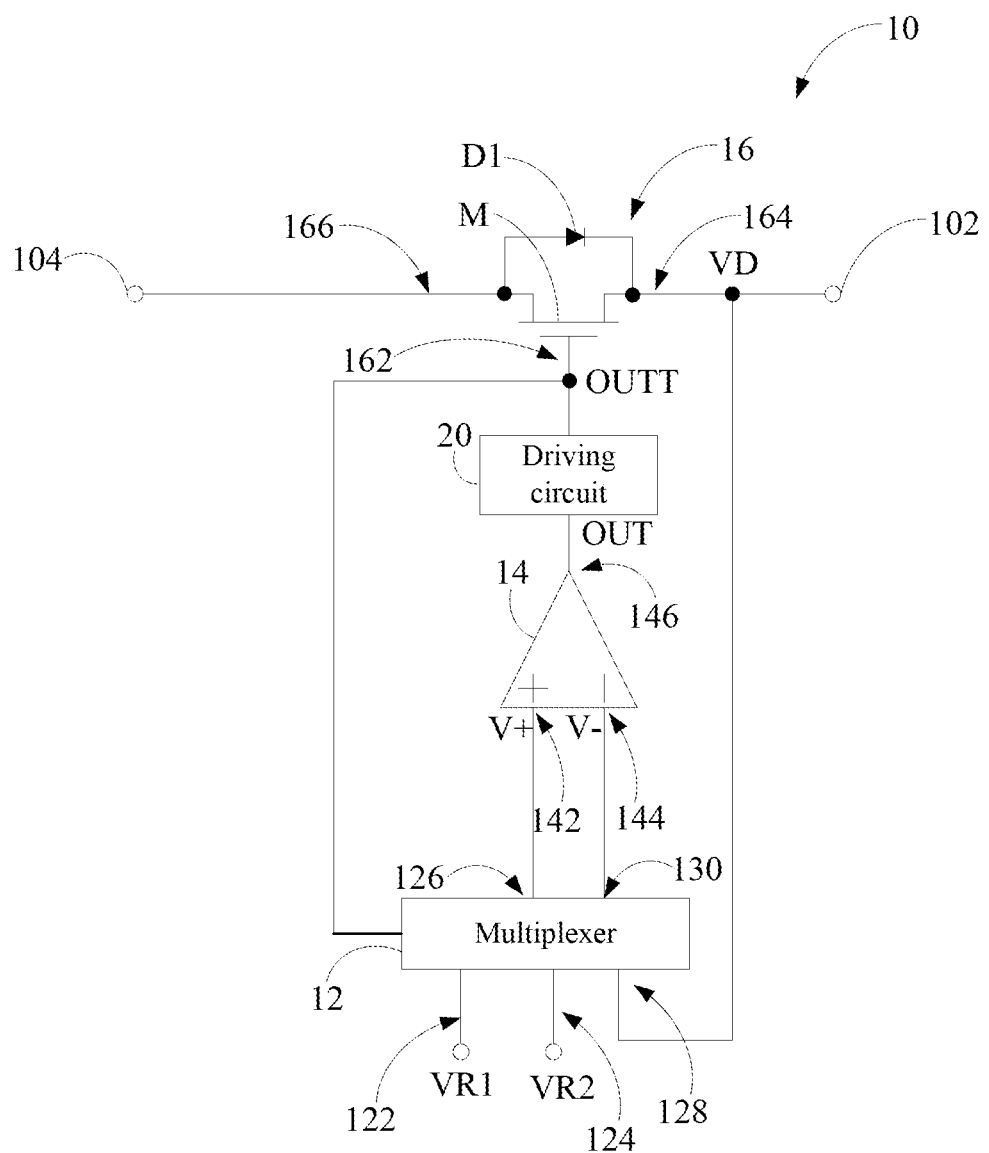
FIG. 8 shows a schematic diagram of the circuit according to the fifth embodiment of the present application.

Moreover, FIG. 8 shows a schematic diagram of the circuit according to the fifth embodiment of the present application. The circuit is based on the one according to the third embodiment. However, the driving signal OUTT is feedbacked to the multiplexer 12 and acts as the comparison reference signal input to the multiplexer 12. The remaining operations of signals are identical to those according to the third embodiment described above. Hence, the details will not be repeated.

In comparison, the synchronous rectification circuits according to the prior art rely on two different circuits to process two reference signals. The error components from two different circuits will accumulate and seriously affecting the accuracy of synchronous rectification. The present application provides an improved synchronous rectification circuit with various embodiments as described above. The multiplexer is coupled to a first reference signal and a second reference signal, Thereby, the multiplexer selects the first reference signal or the second reference signal to input to the multiplexer. Then the comparator compares a detection signal of the switch and generates a comparison result signal to the switch for controlling the switch in synchronous rectification. Hence, the power consumption of the power supplying device and the overall circuit area can be reduced. More importantly, even if the comparator has errors, since the error will be applied to the first and second reference signals concurrently, the errors will be cancelled completely or at least partially. The error accumulation that occurred in the two circuit solutions as described will definitely not happen. Consequently, the requirement in calibration for errors for the synchronous rectification circuit according to various embodiments of the present application is reduced significantly.

According to the above embodiments, the synchronous rectification circuit according to the present application uses the multiplexer to select input signal for the comparator. The comparison result signal output by the comparator is used for controlling the control terminal of the switch and thus achieving synchronous rectification. Besides, the power consumption and circuit area can be reduced.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:
1. A synchronous rectification circuit, comprising:
 a multiplexer, including two input terminals and an output terminal;
 a comparator, coupled to said output terminal of said multiplexer; and
 a switch, including a control terminal coupled to said comparator;

wherein a first reference signal and a second reference signal are coupled to said two input terminals of said multiplexers; said multiplexer selectively outputs said first reference signal or said second reference signal to said comparator according to a comparison reference signal; and said comparator compares a detection signal of said switch according to said first reference signal or said second reference signal and generates a comparison result signal to said switch, and wherein said comparator compares said first reference signal with said detection signal; when said detection signal is smaller than said first reference signal, said comparison result signal controls said switch to turn on; said comparator compares said second reference signal with said detection signal; and when said detection signal is greater than said second reference signal, said comparison result signal controls said switch to cut off.

2. The synchronous rectification circuit of claim 1, wherein said detection signal represents an input voltage signal of said switch.

3. The synchronous rectification circuit of claim 1, wherein said comparison reference signal is said comparison result signal.

4. The synchronous rectification circuit of claim 1, wherein said comparison reference signal is said comparison result signal after delaying.

5. The synchronous rectification circuit of claim 1, further comprising:
a driving circuit, coupled to said comparator and said control terminal of said switch for outputting a driving control signal to said switch according to said comparison result signal output by said comparator.

6. The synchronous rectification circuit of claim 1, wherein when said comparison reference signal is at a first level, said multiplexer transmits said first reference signal to said comparator; when said comparison reference signal is at a second level, said multiplexer transmits said second reference signal to said comparator.

7. The synchronous rectification circuit of claim 1, wherein said comparator includes a positive input terminal and a negative input terminal; said detection signal is coupled to said negative input terminal; and said output terminal of said multiplexer is coupled to said positive input terminal.

8. A synchronous rectification circuit, comprising:
a multiplexer, including two input terminals and an output terminal;
a comparator, coupled to said output terminal of said multiplexer;
a switch, including a control terminal coupled to said comparator; and
a delay circuit, coupled between said multiplexer and said comparator;
wherein a first reference signal and a second reference signal are coupled to said two input terminals of said multiplexers; said multiplexer selectively outputs said first reference signal or said second reference signal to said comparator according to a comparison reference signal; and said comparator compares a detection signal of said switch according to said first reference signal or said second reference signal and generates a comparison result signal to said switch, and wherein said delay circuit delays said comparison result signal for a predetermined time for forming said comparison reference signal transmitted to said multiplexer.

9. A synchronous rectification circuit, comprising:
a multiplexer, including two input terminals and an output terminal;
a comparator, coupled to said output terminal of said multiplexer; and
a switch, including a control terminal coupled to said comparator;
wherein a first reference signal and a second reference signal are coupled to said two input terminals of said multiplexers; said multiplexer selectively outputs said first reference signal or said second reference signal to said comparator according to a comparison reference signal; and said comparator compares a detection signal of said switch according to said first reference signal or said second reference signal and generates a comparison result signal to said switch; and wherein said comparator includes a positive input terminal and a negative input terminal; said output terminal of said multiplexer is coupled to said positive input terminal; said multiplexer further includes another input terminal and another output terminal; said detection signal is coupled to said another input terminal; and said another output terminal is coupled to said negative input terminal.

10. The synchronous rectification circuit of claim 9, wherein when said comparison reference signal is at a first level, said multiplexer transmits said first reference signal to said positive input terminal of said comparator and said detection signal to said negative input terminal of said comparator; when said comparison reference signal is at a second level, said multiplexer transmits said detection signal to said positive input terminal of said comparator and said second reference signal to said negative input terminal of said comparator.

* * * * *